US007724323B2

(12) United States Patent
Katagami et al.

(10) Patent No.: US 7,724,323 B2
(45) Date of Patent: May 25, 2010

(54) PATTERN-FORMING METHOD FOR MANUFACTURING DEVICE HAVING PARTITIONING LAYER FORMED ON FOUNDATION LAYER WITH PRELIMINARY PARTITIONING AND RESIDUE FRAGMENT FORMED BY REMOVING PART OF PARTITIONING LAYER

(75) Inventors: Satoru Katagami, Hara-mura (JP); Atsushi Fukuda, Iwata (JP)

(73) Assignee: Seiko Epson Corporation, Tokyo (JP)

( * ) Notice: Subject to any disclaimer, the term of this patent is extended or adjusted under 35 U.S.C. 154(b) by 1121 days.

(21) Appl. No.: 11/331,049

(22) Filed: Jan. 13, 2006

(65) Prior Publication Data

US 2006/0164742 A1 Jul. 27, 2006

(30) Foreign Application Priority Data

Jan. 21, 2005 (JP) ............................. 2005-013700

(51) Int. Cl.
G02F 1/1335 (2006.01)
(52) U.S. Cl. ........................ 349/106; 349/110; 349/113
(58) Field of Classification Search ......... 349/106–109, 349/113, 114, 110
See application file for complete search history.

(56) References Cited

U.S. PATENT DOCUMENTS 6,501,521 B2 12/2002 Matsushita et al.
6,833,667 B2 12/2004 Hamano et al.
6,870,584 B2 * 3/2005 Kawase et al. .............. 349/106
2004/0146791 A1 * 7/2004 Sakurada et al. ............... 430/7

FOREIGN PATENT DOCUMENTS

| JP | 08-146214 A | 6/1996 |
|---|---|---|
| JP | 08-201793 A | 8/1996 |
| JP | 2000-040584 A | 2/2000 |
| JP | 2001-237067 A | 8/2001 |
| JP | 2002-333622 A | 11/2002 |
| JP | 2003-121635 A | 4/2003 |
| JP | 2003-167116 A | 6/2003 |
| JP | 2003-257661 A | 9/2003 |

* cited by examiner

*Primary Examiner*—John Heyman
(74) *Attorney, Agent, or Firm*—Global IP Counselors, LLP

(57) ABSTRACT

A pattern-forming method includes forming a partitioning layer on a foundation layer; forming a partitioning from the partitioning layer by patterning; and ejecting droplets containing a pattern-forming material onto a pattern-forming area that is enclosed by the foundation layer and the partitioning to form a pattern on the foundation layer. The forming of the partitioning layer includes forming a preliminary partitioning on the foundation layer, the preliminary partitioning including the partitioning and a residue fragment of the partitioning layer that is in the pattern-forming area, and performing patterning on the foundation layer using the residue fragment as a mask, thereby forming an uneven surface on the foundation layer.

9 Claims, 14 Drawing Sheets

PATTERN-FORMING METHOD FOR MANUFACTURING DEVICE HAVING PARTITIONING LAYER FORMED ON FOUNDATION LAYER WITH PRELIMINARY PARTITIONING AND RESIDUE FRAGMENT FORMED BY REMOVING PART OF PARTITIONING LAYER

BACKGROUND

1. Technical Field

The present invention relates a pattern-forming method, a color filter manufacturing method, a color filter, an electro-optical apparatus manufacturing method, and an electro-optical apparatus.

2. Related Art

Recently, color filters having coloring layers of various colors (red, green, blue) have come to be used in liquid crystal display devices, which are electro-optical apparatuses, in order to provide color to the display screen. In the method of manufacturing these color filters, a liquid-phase process is used in which the color filter is formed by coating a coloring layer-forming area, which is enclosed in a light-blocking layer (black matrix), with a solution (coloring layer solution) of a coloring layer-forming material, which is for forming the coloring layers, and then drying the solution.

In the inkjet method in this liquid-phase process, the solution is ejected as minute droplets, such that finer coloring layers can therefore be formed than with other liquid-phase processes (for example, spin coating, dispensing, and the like).

However, in such inkjet methods, in order to prevent the ejected droplets from leaking into the adjacent coloring layer-forming areas, the light-blocking layer is made of a material (liquid-repellent material) that repels droplets. A light-blocking layer shaped to enclose the coloring layer-forming areas is then formed by applying a light-blocking film made of the liquid-repellent material over the entire substrate surface, and then patterning this light-blocking film.

However, if tiny residue fragments of the light-blocking film remain in the coloring layer-forming areas during the steps of patterning the light-blocking film described above, following problems result when the inkjet method is to be carried out.

Specifically, since the light-blocking film is made of liquid-repellent material, the wetting capability of the ejected droplets decreases in the vicinity of the residue of the light-blocking film. Therefore, the ejected droplets do not wet the entire coloring layer-forming areas, which results in non-uniformities in the shape (patterned shape) of the coloring layers, creates discoloration in the display screen of the liquid crystal display device, and causes other problems.

SUMMARY

An advantage of the invention is to provide a pattern-forming method, a color filter manufacturing method, a color filter, an electro-optical apparatus manufacturing method, and an electro-optical apparatus wherein the uniformity of the patterned shape is improved and the productivity is enhanced.

The pattern-forming method of an aspect of the invention includes forming a partitioning layer on a foundation layer; forming a partitioning from the partitioning layer by patterning; and ejecting droplets containing a pattern-forming material onto a pattern-forming area that is enclosed by the foundation layer and the partitioning to form a pattern on the foundation layer. The forming of the partitioning includes forming a preliminary partitioning on the foundation layer, the preliminary partitioning including the partitioning and a residue fragment of the partitioning layer that is in the pattern-forming area, and performing patterning on the foundation layer using the residue fragment as a mask, thereby forming an uneven surface in the pattern-forming area.

According to the pattern-forming method of this aspect of the invention, an uneven surface is formed by the residue fragments formed during the formation of the preliminary partitioning. Therefore, there is no need to provide a separate step for forming the uneven surface, and it is possible to suppress an increase in the number of pattern manufacturing steps. The ejected droplets can then be drawn into within the partitions along the concave parts of the uneven surface of the foundation layer. Thus, a pattern with a more uniform shape can be formed on the foundation layer. Consequently, the uniformity of the pattern shape can be improved, and the patterning productivity can be enhanced.

In this pattern-forming method, it is preferable when the patterning is performed on the foundation layer using the residue fragment as the mask, the residue fragment be removed while the uneven surface is formed on the foundation layer.

According to this pattern-forming method, the residue fragments are removed while the uneven surface is formed on the foundation layer. Therefore, the inadequate drawing in of the droplets that might be caused by remaining residue fragments can be avoided, and a pattern with a more uniform shape can be formed.

In this pattern-forming method, it is preferable that a range of unevenness of the uneven surface on the foundation layer be 0.1 µm or greater.

According to this pattern-forming method, droplets can be drawn in with a greater volume proportionate to the 0.1 µm or greater range of the unevenness in the uneven surface of the foundation layer. Thus, a pattern with a more uniform shape can be formed.

In this pattern-forming method, it is preferable when the patterning is performed on the foundation layer using the residue fragment as the mask, an etching solution for forming the uneven surface on the foundation layer be ejected from a droplet ejection apparatus onto the pattern-forming area.

According to this pattern-forming method, it is possible to eject the etching solution only into the pattern-forming area, and etching can be performed on desired portions of the foundation layer to form the uneven surface thereon without having to form a protective layer or the like that protects areas other than the pattern-forming area.

The pattern-forming method of another aspect of the invention is preferably a color filter manufacturing method. The foundation layer is a surface of a transparent substrate. The pattern-forming area enclosed by the surface of the transparent substrate and the partitioning is a coloring layer-forming area. The pattern-forming material contained in the droplets is a coloring layer-forming material.

According to the color filter manufacturing method of this aspect of the invention, the uniformity in the shape of the coloring layer can be improved, and the productivity of the color filter can be enhanced.

The pattern-forming method of another aspect of the invention is preferably a color filter manufacturing method. The foundation layer is a surface of a transparent substrate. The pattern-forming area enclosed by the surface of the transparent substrate and the partitioning is a reflective layer-forming area. The pattern-forming material contained in the droplets is a reflective layer-forming material.

According to the color filter manufacturing method of this aspect of the invention, the uniformity in the shape of the reflective layer can be improved, and the productivity of the color filter can be enhanced.

The color filter of still another aspect of the invention is preferably manufactured by either of the color filter manufacturing methods described above.

In the color filter of the present invention, the uniformity in the shape of the coloring layer or the reflective layer can be improved, and the productivity of the color filter can be enhanced.

The color filter of still another aspect of the invention includes a transparent substrate; a partition formed on a surface of the substrate; and a coloring layer formed by ejecting droplets containing a coloring layer-forming material onto a coloring layer-forming area that is enclosed by the surface of the substrate and the partition formed thereon. The surface of the substrate has an uneven surface in the coloring layer-forming area.

In the color filter of this aspect of the invention, an uneven surface is formed. The ejected droplets can then be drawn within the partitions along the concave parts of the uneven surface on the one side of the substrate. Thus, a coloring layer with a more uniform shape can be formed in the coloring layer-forming area. Therefore, the uniformity in the shape of the coloring layer can be improved, and the productivity of the color filter can be enhanced.

In this color filter, a range of unevenness of the uneven surface on the surface of the substrate is 0.1 μm or greater.

In this color filter, droplets can be drawn in with a greater volume proportionate to the 0.1 μm or greater range of the unevenness of the uneven surface on the surface of the substrate, and a coloring layer with a more uniform shape can be formed.

This color filter preferably further includes a reflective layer between the surface of the substrate and the coloring layer. The reflective layer is formed by ejecting droplets containing a reflective layer-forming material.

In this color filter, the uniformity in the shape of the reflective layer can be improved, and the productivity of the color filter can be enhanced.

The pattern-forming method of still another aspect of the invention is preferably the electro-optical apparatus manufacturing method. The pattern-formation method is an electro-optical apparatus manufacturing method. The foundation layer is an electrode layer. The pattern-forming area enclosed by the electrode layer and the partitioning is a light-emitting element forming area. The pattern-forming material contained in the droplets is a light-emitting element forming material.

According to the electro-optical apparatus manufacturing method of this aspect of the invention, the uniformity in the shape of the light-emitting element can be improved, and the productivity of the electro-optical apparatus can be enhanced.

The electro-optical apparatus of still another aspect of the invention has an element substrate; a counter substrate; and an electro-optical material layer between the element substrate and the counter substrate. The counter substrate is the color filter described above.

In the electro-optical apparatus of this aspect of the invention, the uniformity in the shape of the color filter can be improved, and the productivity of the electro-optical apparatus can be enhanced.

The electro-optical apparatus of still another aspect of the invention is manufactured by the electro-optical apparatus manufacturing method described above.

In the electro-optical apparatus of this aspect of the invention, the uniformity in the shape of the light-emitting layer or a positive-hole transport layer can be improved, and the productivity of the electro-optical apparatus can be enhanced.

The electro-optical apparatus of still another aspect of the invention includes an electrode layer; a partition formed on the electrode layer; and a light-emitting element formed by ejecting droplets containing a light-emitting element forming material onto a light-emitting element forming area that is enclosed by the electrode layer and the partition formed thereon. The electrode layer has an uneven surface in the light-emitting element forming area.

In the electro-optical apparatus of the present invention, the ejected droplets can be drawn within the partitions along the concave parts of the uneven surface of the electrode layer. Thus, a light-emitting element with a more uniform shape can be formed in the light-emitting element forming area. Therefore, the uniformity in the shape of the light-emitting element can be improved, and the productivity of the electro-optical apparatus can be enhanced.

In this electro-optical apparatus, the range of unevenness of the uneven surface on the electrode layer is 0.1 μm or greater.

In this electro-optical apparatus, droplets can be drawn in with a greater volume proportionate to the 0.1 μm or greater range of the unevenness of the uneven surface, and a light-emitting layer or a positive-hole transport layer with a more uniform shape can be formed.

DESCRIPTION OF EXEMPLARY EMBODIMENTS

Figure 1:
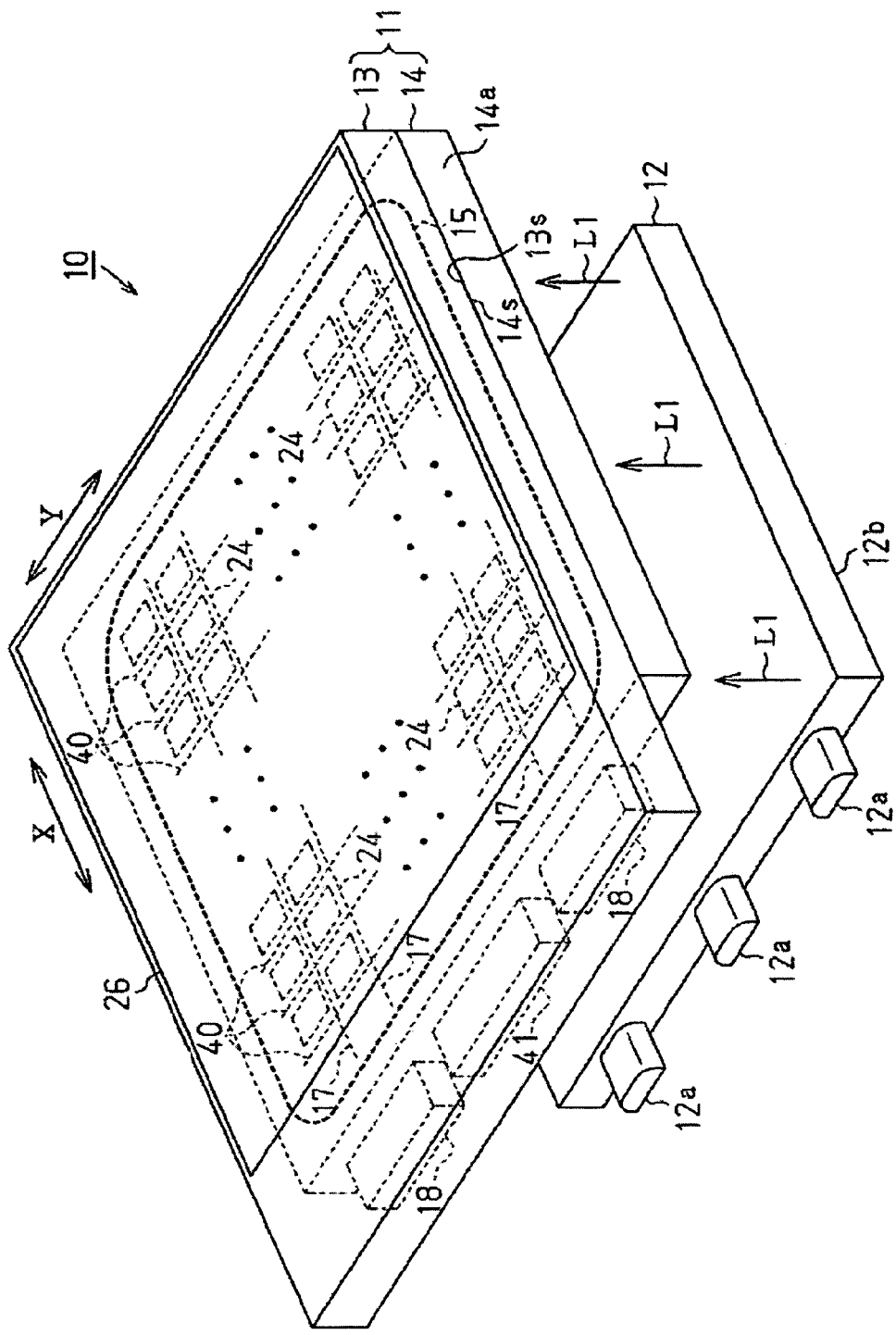
FIG. 1 is a schematic plan view showing a liquid crystal display device of the first embodiment of the present invention.
Figure 2:
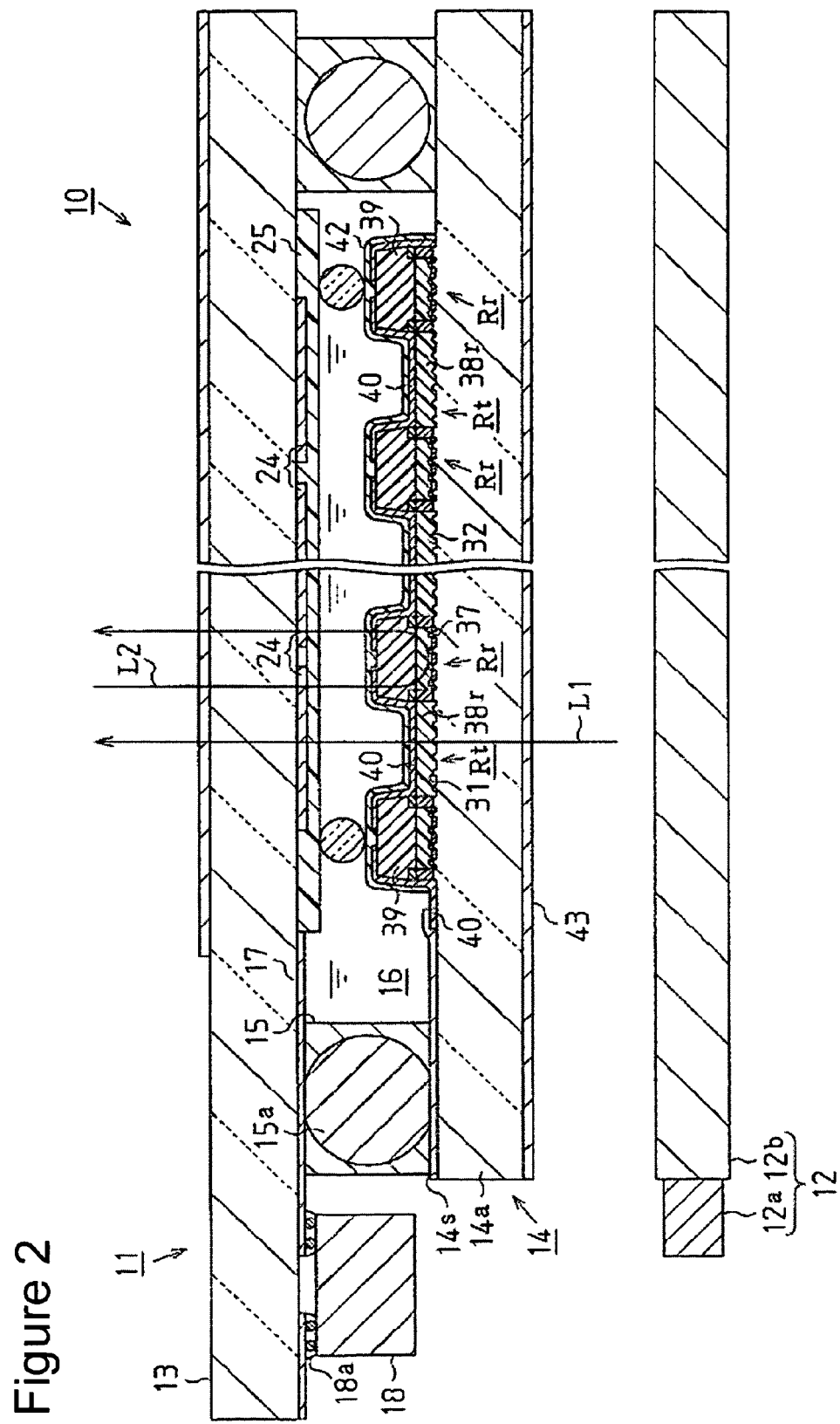
FIG. 2 is a cross-sectional side view showing a liquid crystal display device of the same.

The first embodiment in which the present invention is presented in a more specific form will now be described with reference to FIGS. 1 through 16. FIGS. 1 and 2 are, respectively, a schematic perspective view and a schematic cross-sectional view showing a liquid crystal display device 10 as an electro-optical apparatus.

The liquid crystal display device 10 is an active-matrix semitransparent liquid crystal display device that has a TFD (thin film diode), which is a two-terminal switching element. As shown in FIG. 1, the liquid crystal display device 10 includes a liquid crystal panel 11, and a lighting device 12 for irradiating the liquid crystal panel 11 with planar light L1. The lighting device 12 includes LEDs or other such light sources 12a, and a light guiding member 12b for transmitting the light emitted from the light sources 12a and irradiating the liquid crystal panel 11 with planar light. In the present embodiment, the side of the liquid crystal panel 11 facing the lighting device 12 is the irradiated side, and the side opposite the lighting device 12 is the observed side.

The liquid crystal panel 11 has a square-shaped element substrate 13 on the observed side and a square-shaped color filter 14 as a counter substrate on the irradiated side. As shown in FIG. 2, the element substrate 13 and the color filter 14 are attached by a square frame-shaped seal member 15, and a liquid crystal layer 16 (see FIG. 2) as an electro-optical material layer is sealed in the space between the element substrate 13 and the color filter 14. Spherical conductive members 15a are dispersed in the seal member 15 as shown in FIG. 2, enabling an electrical connection between scanning lines 40 of the color filter 14 and a scanning line drive IC 41 of the element substrate 13, which will be described later.

Figure 3:
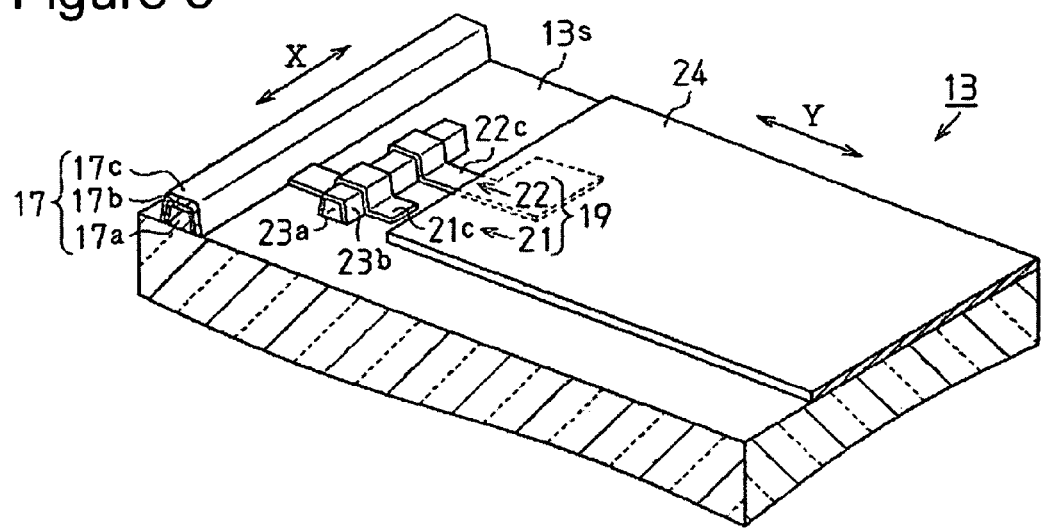
FIG. 3 is a partial perspective view showing an element substrate of the same.
Figure 4:
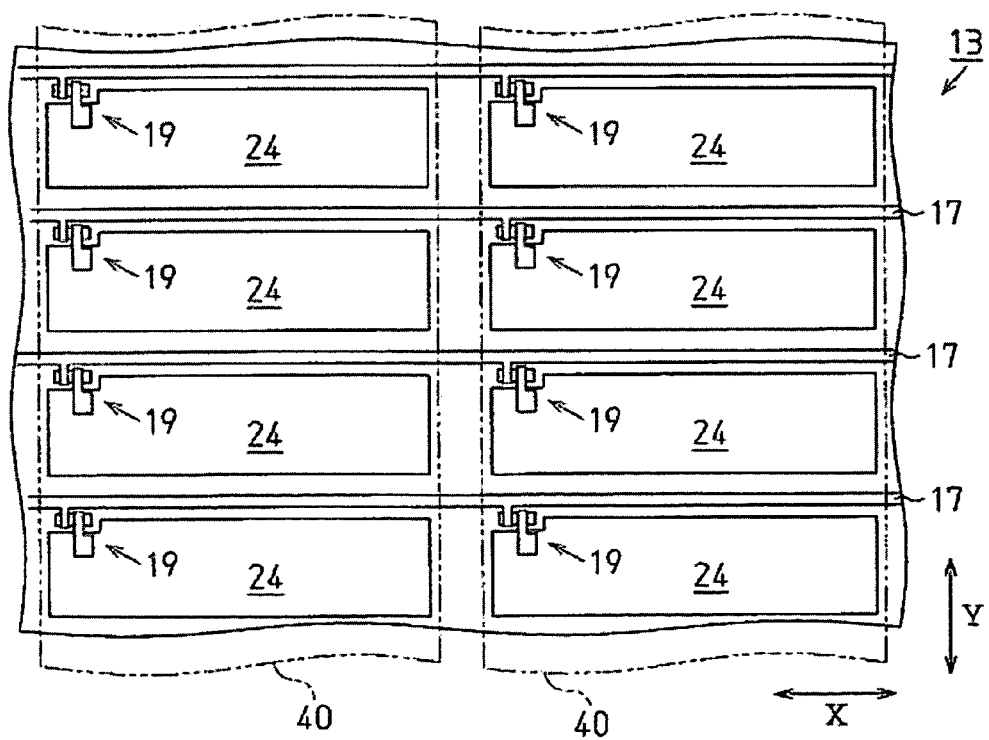
FIG. 4 is a plan view showing an element substrate of the same.

First, the element substrate 13 of the liquid crystal panel 11 will be described. FIGS. 3 and 4 are, respectively, a partial perspective view and a plan view showing the element substrate 13.

The element substrate 13 is a transparent substrate made of an alkali-free glass substrate having a plurality of signal lines 17 extending in one direction formed on one side (element-forming surface 13s), as shown in FIG. 1. In the present embodiment, the direction in which the signal lines 17 are formed is the X direction, and the direction in which the signal lines 17 are arrayed, or, in other words, the direction orthogonal to the X direction, is the Y direction.

Each signal line 17 is formed with a three-layer structure having a first layer 17a made of tungsten, tantalum, or the like on top of the element-forming surface 13s, a second layer 17b formed from an insulating film on top of the first layer 17a, and a third layer 17c made of chrome or the like on top of the second layer 17b, as shown in FIG. 3. The signal lines 17 are all electrically connected to the signal line drive IC 18 mounted at one end of the element substrate 13 by an ACF 18a, as shown in FIG. 2. The signal line drive IC 18 creates a data signal for each of the signal lines 17 on the basis of display data supplied from a control circuit (not shown), and outputs the data signals all at once to the signal lines 17 at a specific timing.

A plurality of electrically connected switching elements 19 are formed on the signal lines 17, as shown in FIG. 4. The switching elements 19 are each configured from a pair of TFDs 21 and 22, as shown in FIG. 3. The TFDs 21 and TFDs 22 have a common first layer 23a made of tungsten, tantalum, or the like, a common second layer 23b formed from an insulating film on top of the first layer 23a, and individual third layers 21c and 22c formed from chrome or the like. The third layers 21c of the TFDs 21 are electrically connected to the third layers 17c of the signal lines 17. The third layers 22c of the TFDs 22 are electrically connected to pixel electrodes 24 made of an ITO or other such transparent conductive film.

When the signal line drive IC 18 outputs data signals to the signal lines 17, the data signals are supplied from the third layers 21c of the TFDs 21 to the pixel electrodes 24 via the second layer 23b, the first layer 23a, the second layer 23b, and the third layers 22c of the TFDs 22 in the order stated. Specifically, the switching elements 19 are elements configured to be back to back (BTB), wherein the electrically reversed TFDs 21 and 22 are connected in series.

An orienting film 25 made of polyimide or the like is formed on the top layer of the pixel electrodes 24 (signal lines 17 and switching elements 19), as shown in FIG. 2. The orienting film 25 is subjected to an orienting process by rubbing or the like, which sets the orientation of the liquid crystal molecules near the orienting film 25 (element substrate 13).

As shown in FIG. 1, a square plate-shaped polarizing plate 26 is attached to the area on which the pixel electrodes 24 are formed on the observed side of the element substrate 13.

Figure 5:
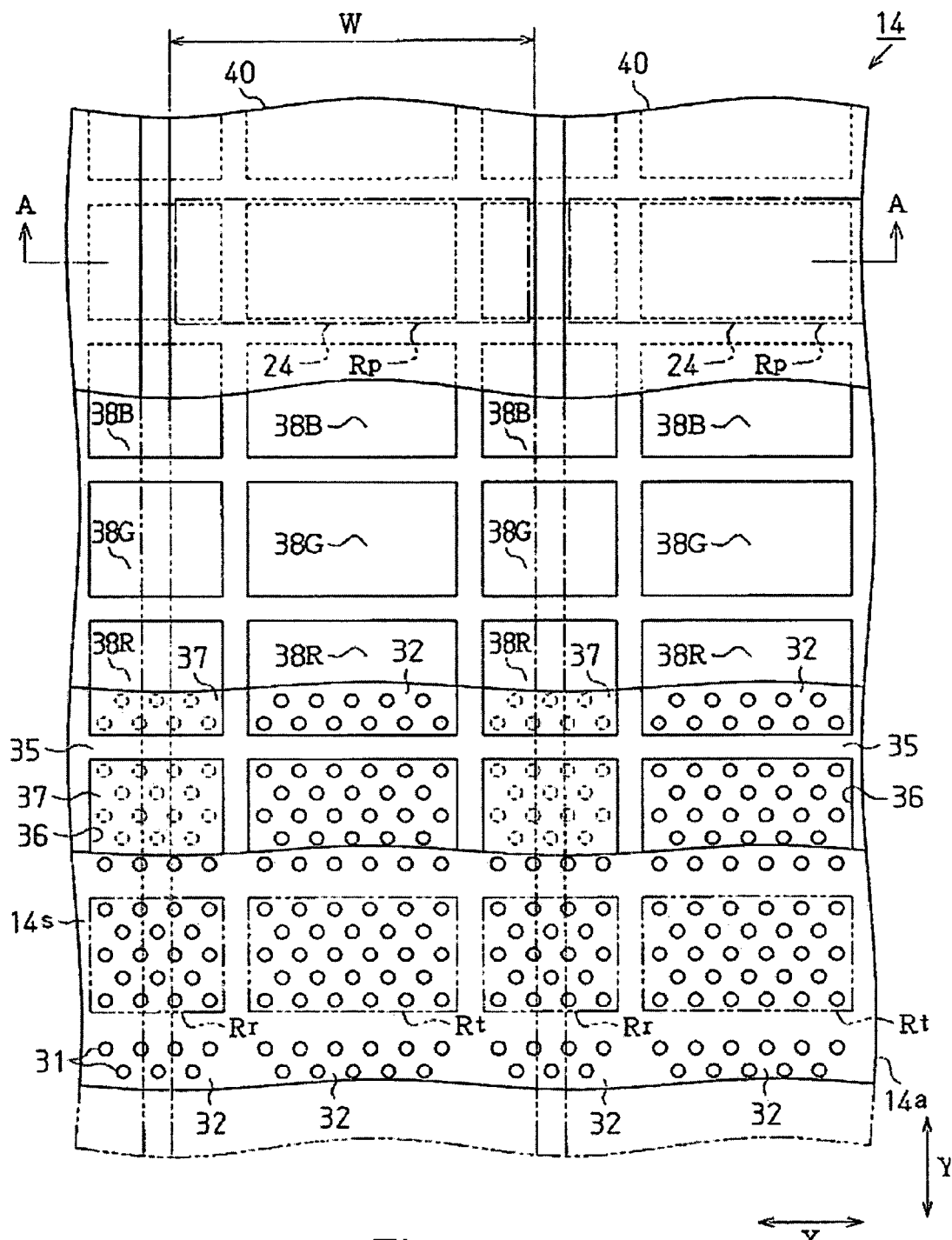
FIG. 5 is a plan view showing a color filter of the same.

Next, the color filter 14 of the liquid crystal panel 11 will be described. FIG. 5 is a plan view showing the color filter 14, and FIG. 6 is a cross-sectional view along the line A-A in FIG. 5.

The color filter 14 includes a transparent substrate 14a (an example of the foundation layer) made of an alkali-free glass substrate, as shown in FIG. 2. A filter-forming surface 14s as a foundation layer is formed on the observed side of the transparent substrate 14a (the side facing the element substrate 13).

Figure 6:
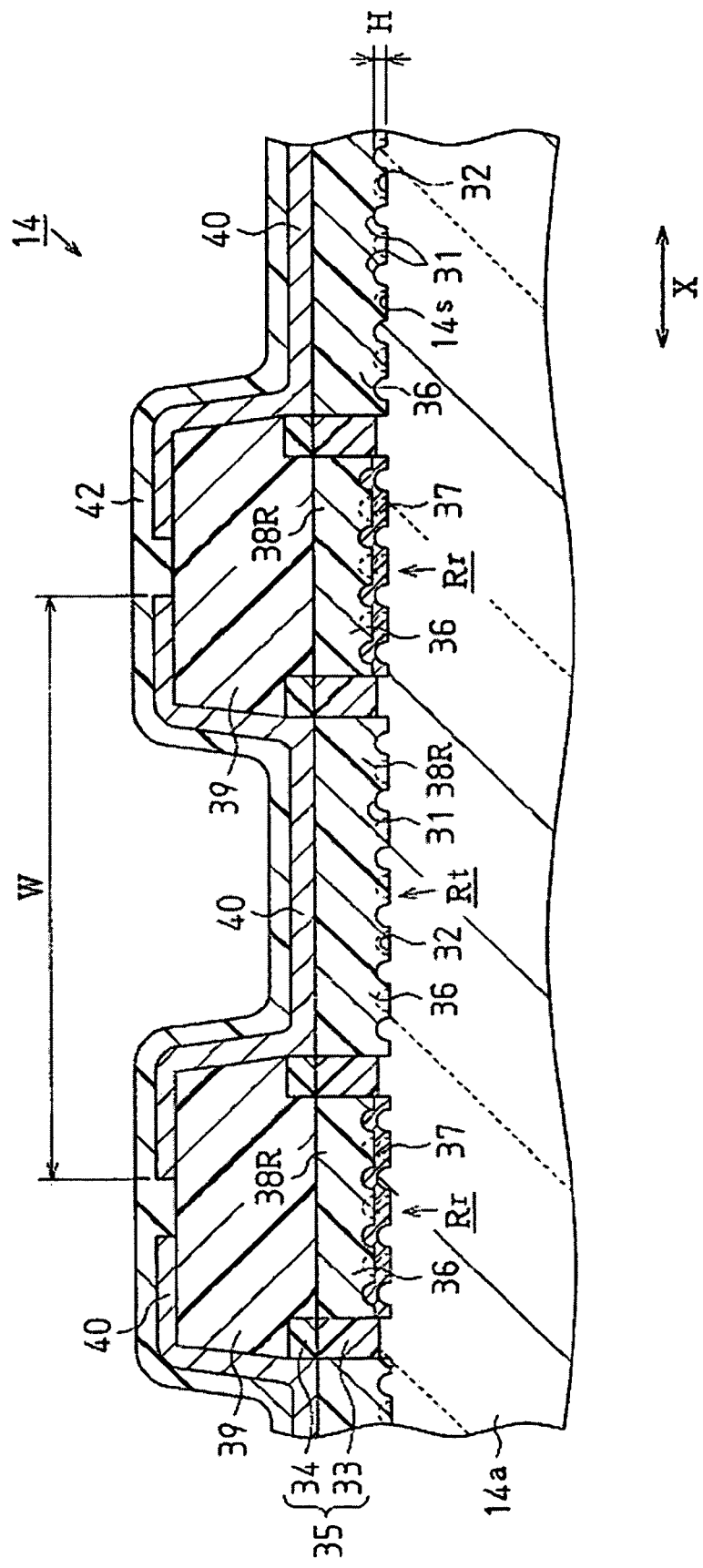
FIG. 6 is a cross-sectional side view showing a color filter of the same.

The filter-forming surface 14s has multiple island-shaped convex surfaces 31, and uneven surfaces 32 having an uneven shape are formed by these island-shaped convex surfaces 31, as shown in FIGS. 5 and 6. The uneven surfaces 32 are arrayed and formed in a matrix pattern so that small square-shaped areas (reflective areas Rr as reflective layer-forming areas) and large square-shaped areas (transparent areas Rt) repeat alternately along the direction in which the signal lines 17 are formed (the y direction). The uneven surfaces 32 are formed in a step for forming uneven surface (step S14 in FIG. 7) to be described later, so that the range H of the unevenness is 0.1 μm or greater, as shown in FIG. 6.

Light-blocking parts 33 are formed in the areas on the filter-forming surface 14s excluding the areas in which the uneven surfaces 32 are formed (reflective areas Rr and transparent areas Rt), as shown in FIG. 6. The light-blocking parts 33 are formed from a so-called positive type of photosensitive material, in which exposure to light Lpr (see FIG. 8) of a specific wavelength causes only the exposed portions to become soluble in an alkali solution or another such developing solution. The light-blocking parts are also formed in a reticular pattern by a thermosetting resin containing carbon black, for example, or another such light-blocking material. Specifically, the light-blocking parts 33 constitute a so-called black matrix that improves the contrast of the image displayed on the observed side by being exposed to light directed to the irradiated side and the observed side.

Liquid-repellent parts 34 are formed on the top sides of the light-blocking parts 33, as shown in FIG. 6. The liquid-repellent parts 34 are formed from a positive type of photosensitive material, similar to the light-blocking parts 33, and constitute a resin layer made of a fluororesin having liquid repelling properties for repelling droplets Ds2 made of a reflective layer solution Lr (see FIG. 12) to be described later, and droplets Ds3 made of a coloring layer solution Lc (see FIG. 14).

Reticular partitions 35 enclosing the uneven surfaces 32 are then formed from the light-blocking parts 33 and the liquid-repellent parts 34, and coloring layer-forming areas 36 as pattern-forming areas are formed from the partitions 35. In other words, the coloring layer-forming areas 36 are configured from the small reflective areas Rr and the large transparent areas Rt, whose bottom surfaces are the uneven surfaces 32.

Reflective layers 37 are formed on the uneven surfaces 32 of the reflective areas Rr. The reflective layers 37 are metallic films that reflect light, and are formed into an uneven shape corresponding to the uneven surfaces 32. As a result of forming the reflective layers 37 into an uneven shape, the external light L2 directed to the observed side is reflected and scattered by the reflective layers 37, as shown in FIG. 2. Meanwhile, in the transparent areas Rt in which the reflective layers 37 are not formed, the light L1 directed to the irradiated side (lighting device 12) is transmitted to the observed side.

As shown in FIG. 5, red coloring layers 38R, green coloring layers 38G, and blue coloring layers 38B, in colors of red (R), green (G), and blue (B), respectively, are repeatedly formed on the top layers of the reflective layers 37 along the direction orthogonal to the signal lines 17 (the Y direction).

Overcoat layers 39 are formed on the top layers of the coloring layers 38R, 38G, and 38B, as shown in FIG. 6. The overcoat layers 39 are formed from a positive type of photosensitive material made of an alkali resin or a polyimide resin, similar to the partitions 35 (light-blocking parts 33 and liquid-repellent parts 34). The thickness of the liquid crystal layer 16 on the reflective areas Rr and the thickness of the liquid crystal layer 16 on the transparent areas Rt can be adjusted, and the luminosity of the light from the observed side to the reflective areas Rr and back again to the observed side can be made uniform, as can the luminosity of the light emitted from the irradiated side to the transparent areas Rt and through to the observed side, according to the thickness of the overcoat layers 39, as shown in FIG. 2.

The red coloring layers 38R, the green coloring layers 38G, and the blue coloring layers 38B are repeatedly formed along the direction (the Y direction) orthogonal to the signal lines 17 on the uneven surfaces 32 of the transparent areas Rt, as shown in FIG. 5, in the same manner as the reflective areas Rr.

Scanning lines 40 extending in the direction orthogonal to the signal lines 17 (the Y direction: the direction perpendicular to the paper surface in FIG. 6) are arrayed in the direction in which the signal lines 17 are formed (the X direction) on the top layers of the coloring layers 38R, 38G, and 38B of the transparent areas Rt and the overcoat layers 39 of the reflective areas Rr, as shown in FIG. 6. The scanning lines 40 are formed from an ITO or another such transparent conductive film, similar to the pixel electrodes 24, and are formed with substantially the same width W in the X direction as the width of the pitch at which the reflective areas Rr (transparent areas Rt) are formed, as shown in FIG. 5.

The scanning lines 40 and the pixel electrodes 24 are arranged so as to overlap in planar fashion as seen from the observed side, and minimal display areas Rp, which are the smallest units of display, are formed by these overlapping areas, as shown in FIG. 5. Specifically, the minimal display areas Rp are formed with substantially the same size as the pixel electrodes 24, and are formed with substantially the same width in the X direction as the width (width W) of the scanning lines 40 in the X direction. The minimal display areas Rp are also formed from areas equal to substantially half of the area occupied by one transparent area Rt and the two reflective areas Rr adjacent to this transparent area Rt, and are capable of emitting light composed of both transmitted light and reflected light.

As shown in FIG. 2, the scanning lines 40 are electrically connected by the conductive members 15a of the seal member 15 to the scanning line drive IC 41 (see FIG. 1) mounted on one end of the element substrate 13 by an ACF, similar to the signal lines 17. The scanning line drive IC 41 selectively drives specific scanning lines 40 from among the plurality of scanning lines 40 at a specific timing on the basis of scanning control signals supplied from a control circuit (not shown), and outputs scanning signals to the selected scanning lines 40.

An orienting film 42 made of polyimide or the like is formed on the top layers of the scanning lines 40, as shown in FIG. 6. The orienting film 42 is subjected to an orienting process by rubbing or the like, which can set the orientation of the liquid crystal molecules near the orienting film 42 (color filter 14).

As shown in FIG. 2, a polarizing plate 43 is attached to the surface of the color filter 14 described above on the side facing the filter-forming surface 14s (the irradiated side).

When scanning signals are outputted to the scanning lines 40 on the pixel electrodes 24 to which data signals are outputted, the switching elements 19 connected to the pixel electrodes 24 turn on according to the difference in potential between the data signals and the scanning signals. When the switching elements 19 turn on, the state of orientation of the liquid crystal molecules on the minimal display areas Rp corresponding to the pixel electrodes 24 is maintained so as to modulate the light L1 or the external light L2 passing through the minimal display areas Rp. The desired full-color screen is then displayed on the observed side of the liquid crystal panel 11 depending on whether or not the modulated light passes through the polarizing plate 43.

(Method for Manufacturing Liquid Crystal Display Device 10)

Next, the method for manufacturing the liquid crystal display device 10 will be described with reference to FIGS. 7 through 16.

Figure 7:
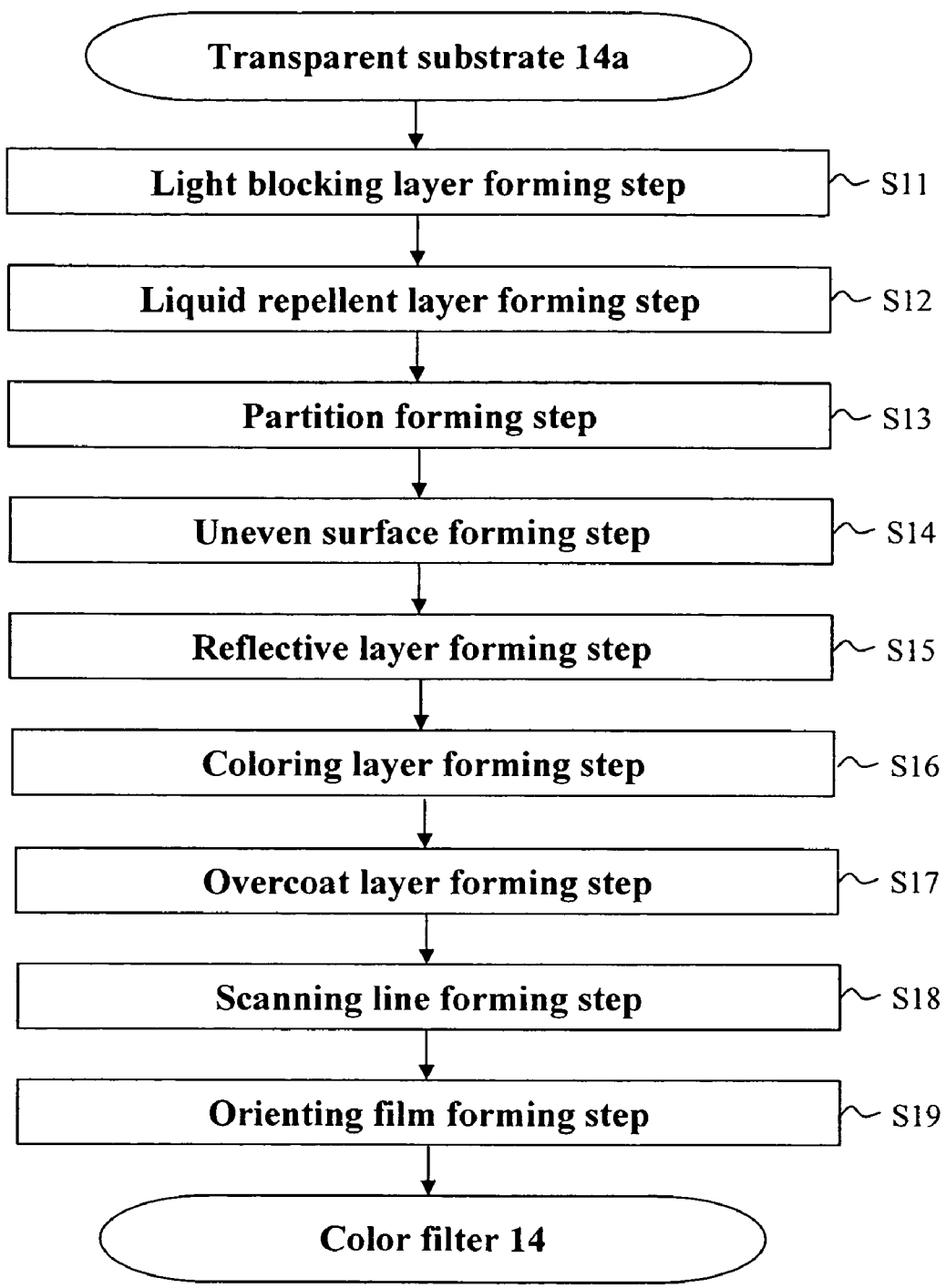
FIG. 7 is a flowchart showing the method for manufacturing a liquid crystal display device of the same.

FIG. 7 is a flowchart showing the steps of manufacturing the liquid crystal display device 10, and FIGS. 8 through 16 are explanatory diagrams for describing the steps of manufacturing the liquid crystal display device 10.

First, the method for manufacturing the color filter 14 will be described.

As shown in FIG. 7, first, a light-blocking layer forming step is performed in which a light-blocking layer 33a is formed by coating the entire surface of the filter-forming surface 14s of the transparent substrate 14a with a light-blocking layer material (step S11). Next, a liquid-repellent layer forming step is performed in which a liquid-repellent layer 34a is formed by coating the top layer of the light-blocking layer 33a with a liquid-repellent layer material (step S12). A partitioning layer configured from the light-blocking layer 33a and the liquid-repellent layer 34a is formed by means of the light-blocking layer forming step and the liquid-repellent layer forming step.

Figure 8:
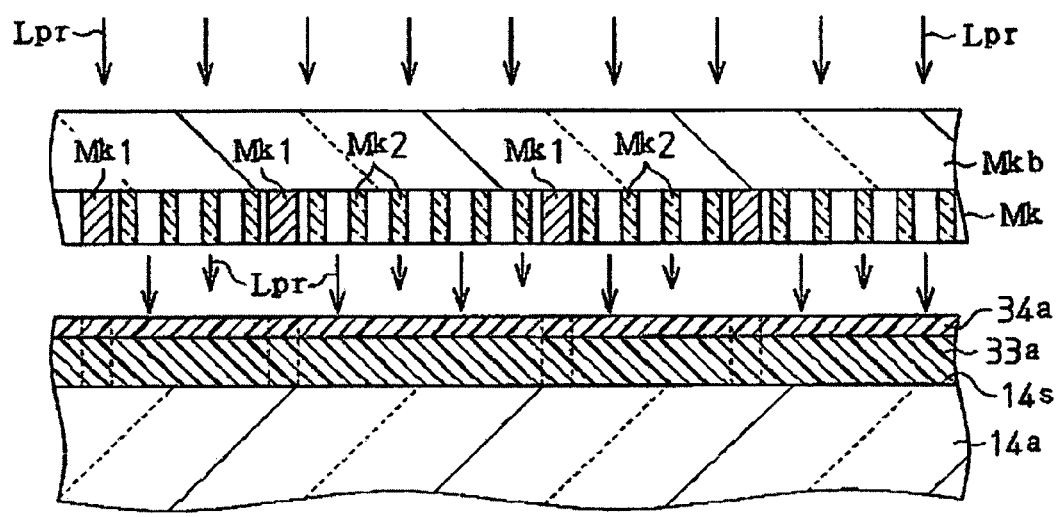
FIG. 8 is a cross-sectional side view showing the method for manufacturing a liquid crystal display device of the same.

As shown in FIG. 7, when the light-blocking layer 33a and the liquid-repellent layer 34a are formed, a partition-forming step is performed in which the partitions 35 are formed by placing a mask Mk at a position facing the filter-forming surface 14s (step S13). The mask Mk has a transparent substrate Mkb for transmitting exposure light Lpr of a specific wavelength. A light-blocking pattern Mk1 for blocking the exposure light Lpr, and a semitransparent pattern Mk2 for transmitting a specific percentage of the exposure light Lpr are formed on one side of the transparent substrate Mkb (the side facing the filter-forming surface 14s), as shown in FIG. 8. The light-blocking pattern Mk1 is a pattern configured to face the partitions 35 (light-blocking parts 33 and liquid-repellent parts 34) in a state in which the pattern faces the filter-forming surface 14s, and the semitransparent pattern Mk2 is a pattern that faces the island-shaped convex surfaces 31.

Figure 9:
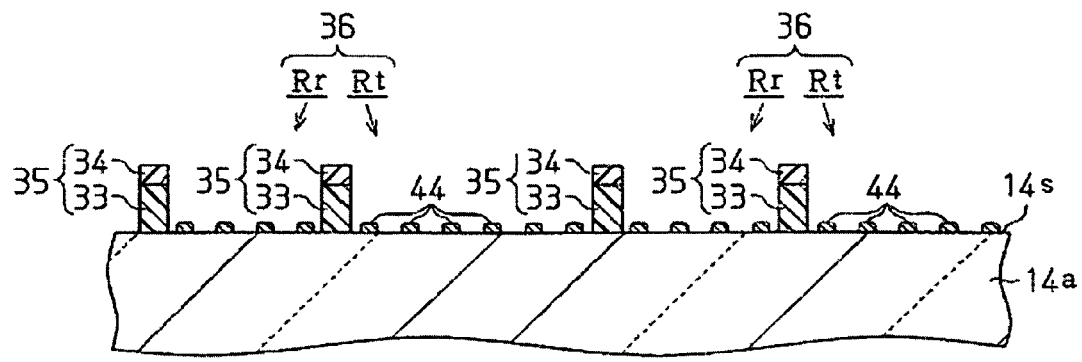
FIG. 9 is a cross-sectional side view showing the method for manufacturing a liquid crystal display device of the same.

When the partitioning layer (light-blocking layer 33a and liquid-repellent layer 34a) is exposed to exposure light Lpr through the mask Mk and is developed, the partitions 35 composed of the light-blocking parts 33 and the liquid-repellent parts 34 are formed on the filter-forming surface 14s at a position across from the light-blocking pattern Mk1, as shown in FIG. 9. In other words, the reflective areas Rr and the transparent areas Rt (coloring layer-forming areas 36) are formed in sections. Furthermore, multiple residue fragments (residue fragments 44) of the light-blocking layer 33a which are of a smaller size than the partitions 35 are formed at positions in the coloring layer-forming areas 36 across from the semitransparent pattern Mk2. The light-blocking parts 33 and the residue fragments 44 are collectively referred to as a preliminary partition 33b.

As shown in FIG. 7, when the partitions 35 and the residue fragments 44 are formed on the filter-forming surface 14s, an uneven surface forming step is performed in which an etching solution Le (see FIG. 10) made of ammonium fluoride or the like is ejected from the droplet ejection apparatus into the coloring layer-forming areas 36, and the uneven surfaces 32 are formed, using the partitions 35 and the residue fragments 44 as masks (step S14).

Figure 10:
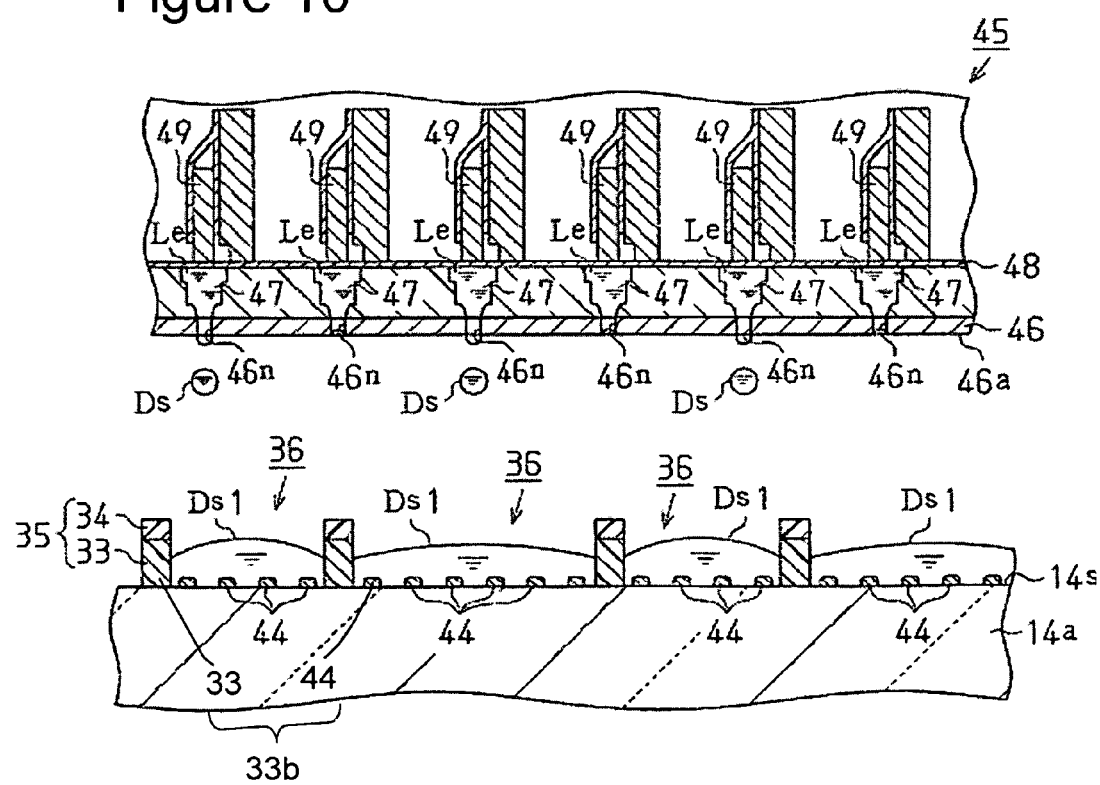
FIG. 10 is a cross-sectional side view showing the method for manufacturing a liquid crystal display device of the same.

This droplet ejection apparatus is provided with a droplet ejection head 45, and a nozzle plate 46 is provided on the bottom side of the droplet ejection head 45, as shown in FIG. 10. Multiple nozzles 46n for ejecting an etching solution Le are formed facing upward in the bottom surface (nozzle forming surface 46a) of the nozzle plate 46. Supply chambers 47 that are communicated with a storage tank (not shown) and that are capable of supplying the etching solution Le into the nozzles 46n are formed in the top sides of the nozzles 46n. A vibrating plate 48 that vibrates vertically back and forth to expand and reduce the capacity in the supply chambers 47, and piezoelectric elements 49 that expand and contract vertically to vibrate the vibrating plate, are disposed on the top sides of the supply chambers 47. The transparent substrate 14a that is conveyed to the droplet ejection apparatus is then positioned with the filter-forming surface 14s parallel to the nozzle forming surface 46a, as shown in FIG. 10.

When the etching solution Le is supplied into the supply chambers 47, and a drive signal for forming the uneven surfaces 32 is inputted to the droplet ejection head 45, the piezoelectric elements 49 positioned directly above the coloring layer-forming areas 36 expand and contract to expand and reduce the capacity of the supply chambers 47 on the basis of the drive signal. At this time, when the capacity of the supply chambers 47 decreases, an amount of the etching solution Le equivalent to the reduced capacity is ejected as minute droplets Ds from the nozzles 46n, and the ejected minute droplets Ds are deposited on the corresponding filter-forming surface 14s. Then, when the capacity of the supply chambers 47 increases, an amount of etching solution Le proportionate to the increased capacity is supplied into the supply chambers 47 from the storage tank (not shown).

Figure 11:
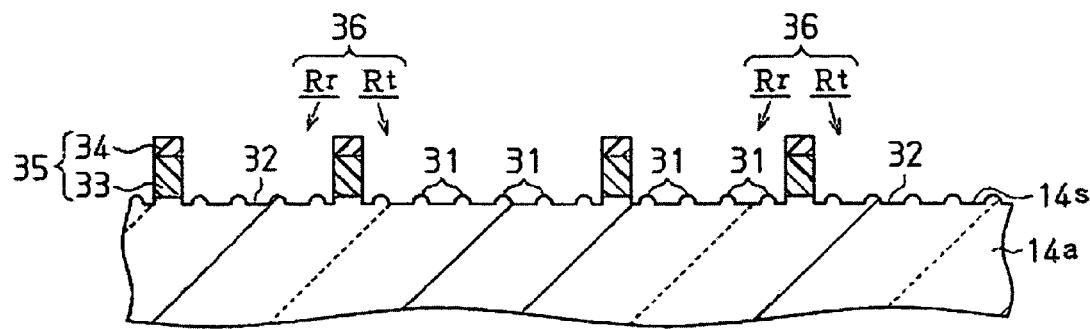
FIG. 11 is a cross-sectional side view showing the method for manufacturing a liquid crystal display device of the same.

In other words, the droplet ejection head 45 ejects a specific volume of etching solution Le onto the coloring layer-forming areas 36 by means of this expansion and contraction of the supply chambers 47, and forms droplets Ds1 composed of the etching solution Le in the coloring layer-forming areas 36. When the device is allowed to stand for a specific amount of time in the state in which the droplets Ds1 have been formed, the filter-forming surface 14s in the coloring layer-forming areas 36 is etched, and convexities (island-shaped convex surfaces 31) are formed at the positions masked by the residue fragments 44, as shown in FIG. 11. The uneven surfaces 32 are then formed by the differences in the amount of etching between the island-shaped convex surfaces 31 and the surrounding filter-forming surface 14s.

It is thereby possible to supply the etching solution Le to only the coloring layer-forming areas 36, and the uneven surfaces 32 can be formed without forming an etching-resistant protective layer or the like on the areas other than the coloring layer-forming areas 36 (for example, the surface on the side facing the filter-forming surface 14s).

The residue fragments 44 lose some of their adhesiveness to the filter-forming surface 14s due to the etching of the filter-forming surface 14s by the etching solution Le, and are simultaneously removed when the etching solution Le is removed and washed off from the coloring layer-forming areas 36.

Figure 12:
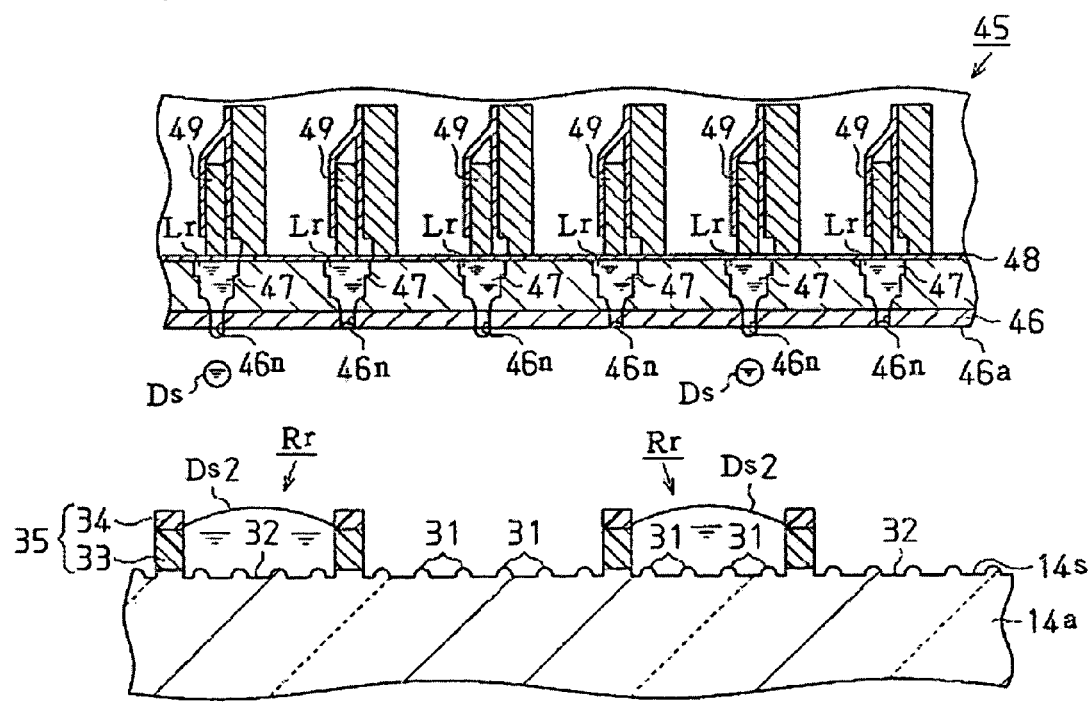
FIG. 12 is a cross-sectional side view showing the method for manufacturing a liquid crystal display device of the same.
Figure 13:
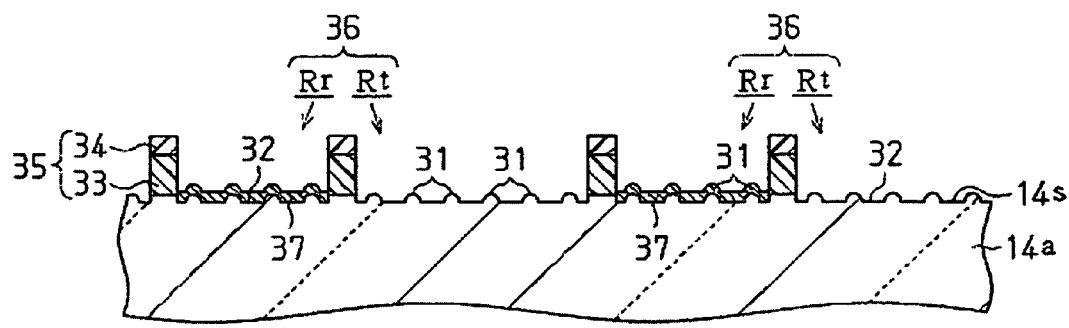
FIG. 13 is a cross-sectional side view showing the method for manufacturing a liquid crystal display device of the same.

As shown in FIG. 7, when the uneven surfaces 32 are formed in the coloring layer-forming areas 36, a reflective layer forming step is performed in which the reflective layers 37 are formed on the uneven surfaces 32 of the reflective areas Rr (step S15). Specifically, as shown in FIG. 12, a solution of a reflective layer-forming material (reflective layer solution Lr) as a pattern-forming material composed of metallic particles or the like is supplied to the supply chambers 47 of the droplet ejection apparatus, and minute droplets Ds of the reflective layer solution Lr are ejected onto the uneven surfaces 32 of the reflective areas Rr by the droplet ejection head 45. The ejected minute droplets Ds are deposited on the uneven surfaces 32, and are drawn into the inner edges (partitions 35) of the reflective areas Rr while being guided by the unevenness of the uneven surfaces 32. The droplets Ds2 of the reflective layer solution Lr that wet the entire reflective areas Rr can thereby be formed, and reflective layers 37 having a uniform thickness that corresponds to the uneven shape of the uneven surfaces 32 can be formed on the uneven surfaces 32 of the reflective areas Rr as shown in FIG. 13 by drying and solidifying the droplets Ds2.

Figure 14:
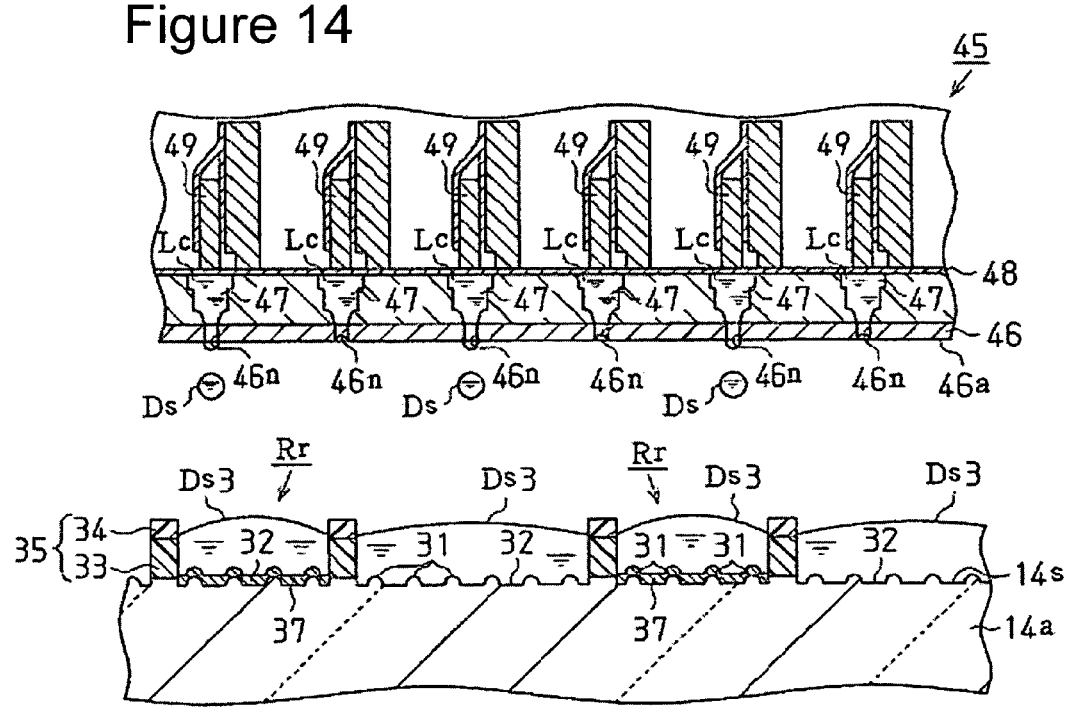
FIG. 14 is a cross-sectional side view showing the method for manufacturing a liquid crystal display device of the same.
Figure 15:
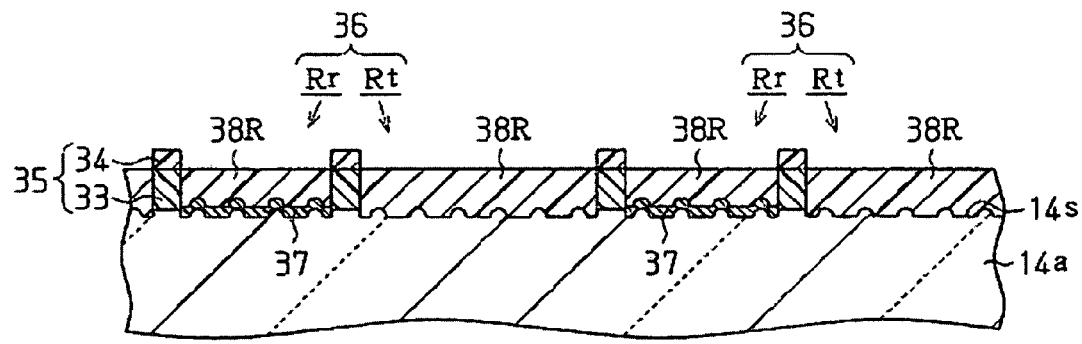
FIG. 15 is a cross-sectional side view showing the method for manufacturing a liquid crystal display device of the same.

As shown in FIG. 7, when the reflective layers 37 are formed on the reflective areas Rr, a coloring layer forming step is performed in which the coloring layers 38R, 38G, and 38B are formed on the reflective areas Rr and the transparent areas Rt (coloring layer-forming areas 36) (step S16). Specifically, a liquid dispersion (coloring layer solution Lc) in which colored pigments are dispersed as a pattern-forming material for forming the red coloring layers 38R (as well as green coloring layers 38G and blue coloring layers 38B) is supplied to the supply chambers 47 of the droplet ejection apparatus, as shown in FIG. 14. Minute droplets Ds of the coloring layer solution Lc are then ejected onto the reflective layers 37 of the reflective areas Rr and the uneven surfaces 32 by the droplet ejection head 45, similar to the reflective layer forming step. The ejected minute droplets Ds are deposited on the uneven surfaces 32, and are drawn into the inner edges (partitions 35) of the coloring layer-forming areas 36 while being guided by the unevenness in the uneven surfaces 32. The droplets Ds3 of the coloring layer solution Lc that wet the entire coloring layer-forming areas 36 can thereby be formed, and red coloring layers 38R (as well as green coloring layers 38G and blue coloring layers 38B) having a uniform shape can be formed on the reflective layers 37 and the uneven surfaces 32 as shown in FIG. 15 by drying and solidifying the droplets Ds3.

Figure 16:
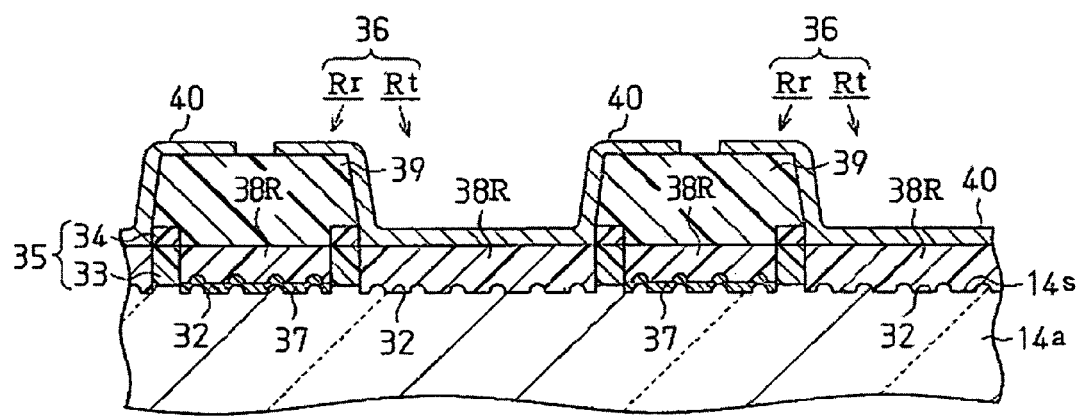
FIG. 16 is a cross-sectional side view showing the method for manufacturing a liquid crystal display device of the same.

As shown in FIG. 7, when the coloring layers 38R, 38G, and 38B are formed, an overcoat layer forming step for forming the overcoat layers 39, a scanning line forming step for forming the scanning lines 40, and an orienting film forming step for forming the orienting film 42 are performed in the stated order (steps S17, S18, S19). Specifically, the coloring layers 38R, 38G, and 38B are coated with a positive-type photosensitive material made of an alkali resin or a polyimide resin or the like, and this photosensitive material is patterned, whereby the overcoat layers 39 are formed on the coloring layers 38R, 38G, and 38B of the reflective areas Rr, as shown in FIG. 16. When the overcoat layers 39 are formed, a transparent conductive film made of ITO or the like is deposited over the entire filter-forming surface 14s, and this transparent conductive film is patterned, whereby the scanning lines 40 are formed as shown in FIG. 16. When the scanning lines 40 are formed, the entire filter-forming surface 14s is coated with a transparent resin made of polyimide or the like, and this transparent resin is subjected to rubbing or another such orienting process to form the orienting film 42.

A color filter 14 having reflective layers 37 of uniform shape in the reflective areas Rr, and coloring layers 38R, 38G, and 38B of uniform shape in the coloring layer-forming areas 36 can thereby be manufactured.

When the color filter 14 has been manufactured, the color filter 14 and the element substrate 13 manufactured by a conventional manufacturing technique are bonded together by a seal member 15, and liquid crystal is poured in between the color filter 14 and the element substrate 13 through an inlet (not shown) in this seal member 15 to form a liquid crystal layer 16. When the liquid crystal layer 16 is formed, the polarizing plates 26 and 43 are attached to the color filter 14 and the element substrate 13, and the drive ICs 18 and 41 are mounted on the element substrate 13. The liquid crystal panel 11 can thereby be formed, and the liquid crystal display device 10 can be manufactured by installing a lighting device 12 on the liquid crystal panel 11.

Next, the effects of the first embodiment configured as outlined above will be described.

(1) According to the embodiment described above, before the coloring layers 38R, 38G, and 38B are formed, the uneven surfaces 32 whose range of the unevenness of the coloring layer-forming areas 36 is 0.1 μm or greater are formed, and minute droplets Ds of the coloring layer solution Lc are ejected to form droplets Ds3 on the uneven surfaces 32 or the reflective layers 37.

Therefore, the minute droplets Ds can be drawn into the inner edges (partitions 35) of the coloring layer-forming areas 36 while being guided by the uneven shape of the uneven surfaces 32, and droplets Ds3 of the coloring layer solution Lc that wet the entire coloring layer-forming areas 36 can be formed. As a result, the coloring layers 38R, 38G, and 38B can be formed with a uniform shape, and the productivity of the color filter 14, and hence the productivity of the liquid crystal display device 10 as well, can be enhanced.

(2) According to the embodiment described above, before the coloring layers 38R, 38G, and 38B of the reflective areas Rr are formed, the uneven surfaces 32 are formed on the coloring layer-forming areas 36, and minute droplets Ds of the reflective layer solution Lr are ejected to form droplets Ds2 on the uneven surfaces 32.

Therefore, droplets Ds2 of the reflective layer solution Lr that wet the entire reflective areas Rr can be formed, and reflective layers 37 having a uniform thickness that corresponds to the uneven shape of the uneven surfaces 32 can be formed. As a result, a reflective color filter 14 having reflective layers 37 with a uniform shape can be formed.

(3) According to the embodiment described above, residue fragments 44 are efficiently formed when the partitioning layer is patterned, and the residue fragments 44 are used as the mask to form the uneven surfaces 32. Therefore, the uneven surfaces 32 can be formed without a separate step in which a mask for forming the uneven surfaces 32 is formed. As a result, the productivity of the color filter 14, and hence the productivity of the liquid crystal display device 10 as well, can be enhanced.

(4) According to the embodiment described above, when the partitions 35 and the residue fragments 44 are used as the mask to form the filter-forming surface 14s, the residue fragments 44 are removed by washing with the etching solution Le. Therefore, the wetting capability of the minute droplets Ds can be improved proportionate to the reliable removal of the residue fragments 44 or the residue.

(5) According to the embodiment described above, an etching solution Le is supplied only into the coloring layer-forming areas 36 by the droplet ejection apparatus. Therefore, the uneven surfaces 32 can be formed without forming an etching solution-resistant protective film or the like in the areas other than the coloring layer-forming areas 36 (for example, the side facing the filter-forming surface 14s). As a result, the productivity of the color filter 14, and hence the productivity of the liquid crystal display device 10 as well, can be enhanced.

Next, the second embodiment in which the present invention is presented in more specific form will be described with reference to FIGS. 17 through 19. In the second embodiment, the foundation layer (filter-forming surface 14s) in the first embodiment described above is modified and given a specific form of an organic electro-luminescence display (organic EL display) as an electro-optical apparatus. Therefore, the point of difference, which is the foundation layer, will now be described in detail.

Figure 17:
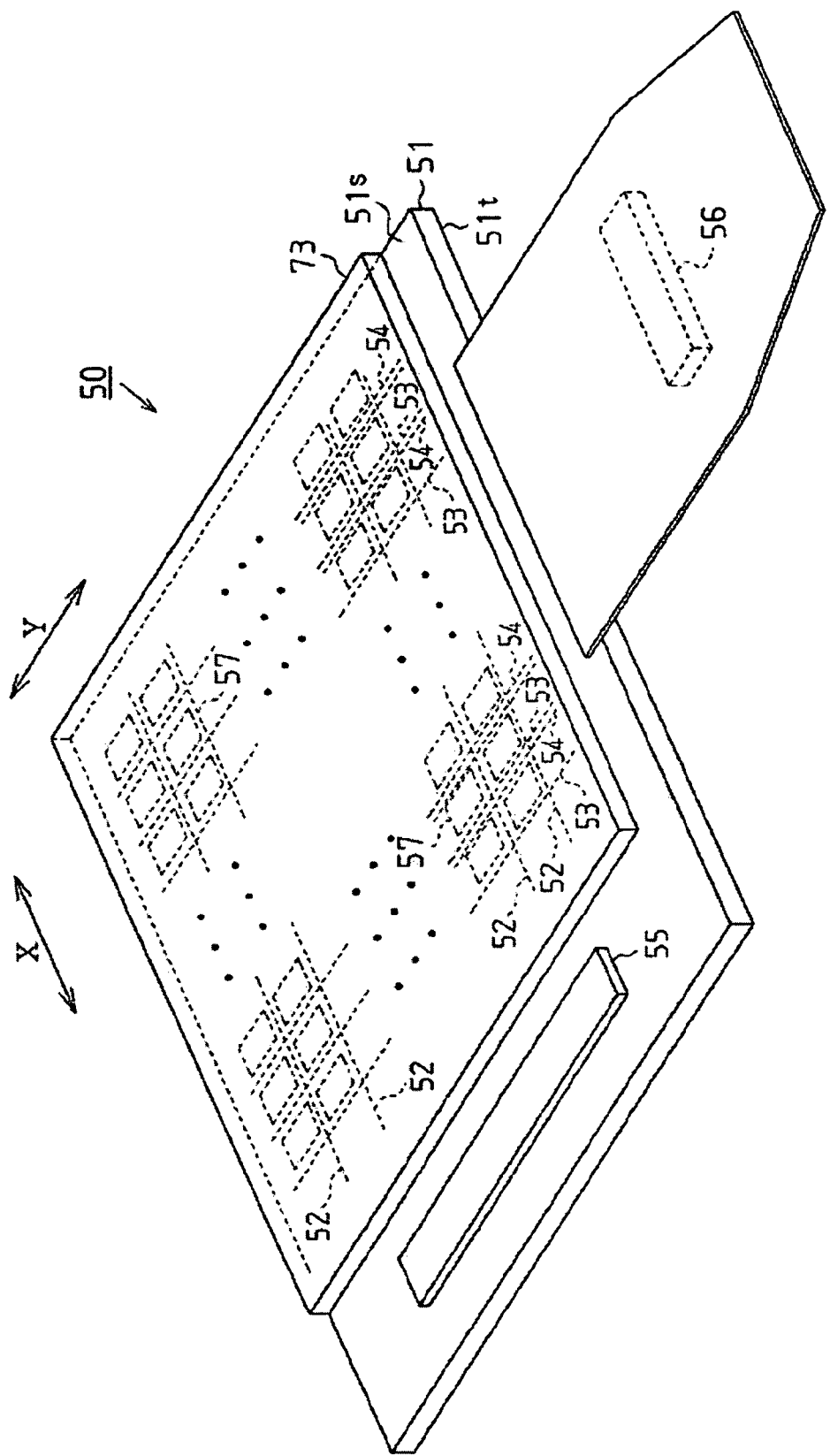
FIG. 17 is a perspective view showing an organic EL display of the second embodiment of the invention.

A transparent substrate 51 is provided to an organic EL display 50, as shown in FIG. 17. The transparent substrate 51 is an alkali-free glass substrate formed into a square shape. The substrate has on one side surface thereof (element-forming surface 51s) a plurality of scanning lines 52 extending in one direction (the X direction in FIG. 17), a plurality of signal lines 53 extending in the direction (the Y direction in FIG. 17) orthogonal to the scanning lines 52, and power source lines 54 established on the signal lines 53.

The scanning lines 52 and the signal lines 53 are connected to their respective corresponding scanning line drive circuit 55 and signal line drive circuit 56. The scanning line drive circuit 55 selectively drives specific scanning lines 52 from among the plurality of scanning lines 52 at a specific timing on the basis of scanning control signals supplied from a control circuit (not shown), and outputs scanning signals to the selected scanning lines 52. The signal line drive circuit 56 creates display data signals on the basis of display data supplied from the control circuit (not shown), and outputs the display data signals to the corresponding signal lines 53 at a specific timing. All the power source lines 54 are connected to a common power source line (not shown), which is designed to supply drive power to the power source lines 54.

A plurality of pixels 57 arrayed in a matrix pattern are formed at the intersecting positions of the signal lines 53 and scanning lines 52 by being connected to the corresponding signal lines 53, power source lines 54, and scanning lines 52.

Figure 18:
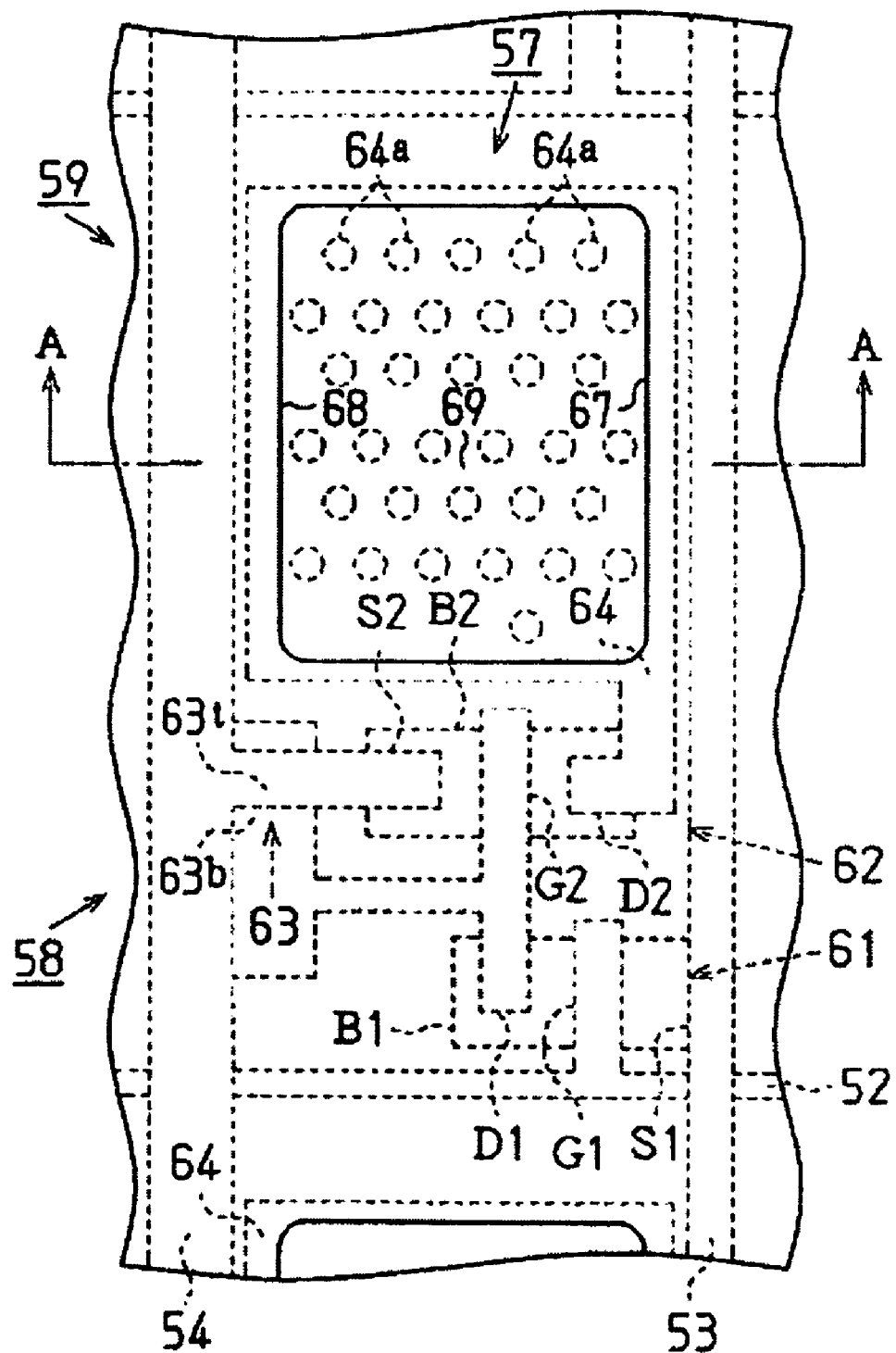
FIG. 18 is a plan view showing a pixel of the same.
Figure 19:
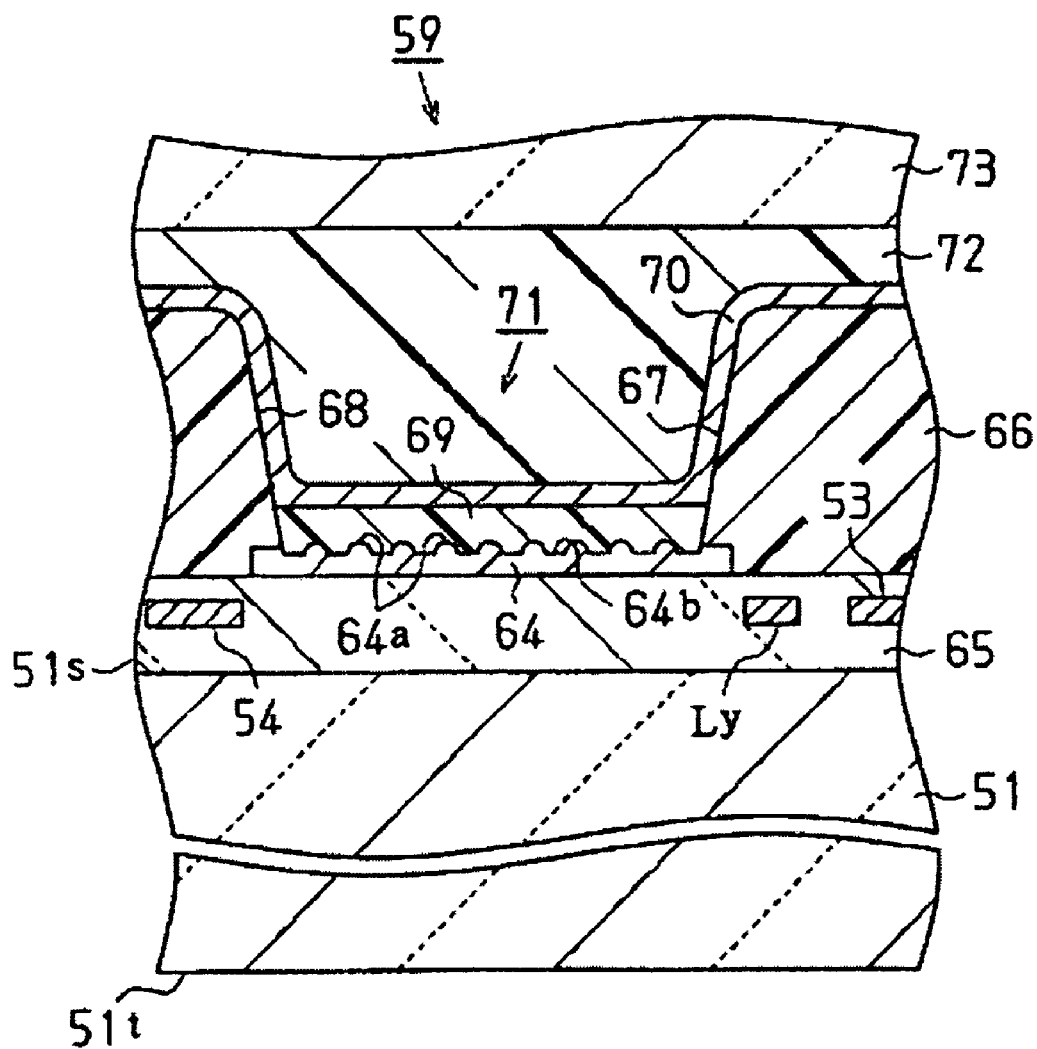
FIG. 19 is a cross-sectional side view showing a light-emitting element of the same.

FIG. 18 is a schematic plan view showing the layout of a pixel 57, and FIG. 19 is a schematic cross-sectional view along the single dashed line A-A in FIG. 18.

A control element forming area 58 and a light-emitting element forming area 59 are formed in segmented manner in the pixel 57, as shown in FIG. 18. A switching TFT 61, a drive TFT 62, and a holding capacitor 63 are included in the control element forming area 58.

A gate G1, source S1, and drain D1 of the switching TFT 61 are electrically connected to a corresponding scanning line 52, signal line 53, and lower electrode 63b of the holding capacitor 63, respectively. A gate G2, source S2, and drain D2 of the drive TFT 62 are respectively connected to the lower electrode 63b of the holding capacitor 63 (drain D1 of the switching TFT 61), an upper electrode 63t of the holding capacitor 63, and an anode 64 (another example of the foundation layer) of the light-emitting element forming area 59, to be described later.

The holding capacitor 63 is a capacitor having an insulating film 65 (see FIG. 19) as a capacitance film between the lower electrode 63b and the upper electrode 63t. The upper electrode 63t is electrically connected to the corresponding power source line 54. An insulating film 65 (see FIG. 19) made of a silicon oxide film or the like is formed between the layers and lines of the TFTs 61 and 62, the holding capacitor 63, and the lines 52, 53, and 54, and the layers and lines are electrically insulated by this insulating film 65.

When the scanning line drive circuit 55 sequentially inputs scanning signals to the gates G1 of the corresponding switching TFTs 61 via the scanning lines 52 (when sequential line scanning is performed), the selected switching TFTs 61 turn on for a selected period of time. When the switching TFTs 61 turn on, the display data signals outputted from the signal line drive circuit 56 are supplied to the lower electrodes 63b of the holding capacitors 63 via the corresponding signal lines 53 and switching TFTs 61. When the display data signals are supplied to the lower electrodes 63b, the holding capacitors 63 store an electric charge equivalent to the display data signals in the capacitance film. When the switching TFTs 61 turn off, a drive electric current equivalent to the electric charge stored in the holding capacitors 63 is supplied to the anodes 64 as electrode layers in the light-emitting element forming areas 59 via the drive TFTs 62.

Next, the configuration of the light-emitting element forming area 59 of each pixel 57 will be described.

Light-emitting element forming areas 59 are formed on the top sides of the pixels 57, as shown in FIG. 18. Anodes 64 as transparent electrodes are formed in the light-emitting element forming areas 59, which constitute the top layers of the insulating film 65, as shown in FIG. 19. The anodes 64 constitute a light-transmissive transparent conductive film, and the ends thereof are electrically connected to the drains D2 of the drive TFTs 62, as shown in FIG. 18.

The top surfaces of the anodes 64 have multiple island-shaped convex surfaces 64a, and uneven surfaces 64b having an uneven shape are formed by these island-shaped convex surfaces 64a in the same manner as in the first embodiment. Partition parts 66 for insulating the anodes 64 are formed on the top layers of the anodes 64. The partition parts 66 are formed from a fluororesin or another such organic material for repelling droplets, described later, which is a so-called positive-type photosensitive material in which exposure to light of a specific wavelength causes only the exposed portions to become soluble in an alkali solution or another such developing liquid.

Receiving holes 67 that open towards the top side in a tapered shape are formed in the partition parts 66 near the centers of the anodes 64. Providing the receiving holes 67 to the partition parts 66 allows partitions 68 that enclose the top surfaces of the anodes 64 (uneven surfaces 64b) to be formed, and organic EL layer forming areas to be defined as pattern-forming areas by the partitions 68 and the uneven surfaces 64b.

Organic electro-luminescence layers (organic EL layers 69) that constitute a pattern are formed in the organic EL layer forming areas (top layers of the uneven surfaces 64b). These organic EL layers 69 are organic compound layers composed of two layers, a positive-hole transport layer and a light-emitting layer. The organic EL layers 69 are formed by forming droplets containing a light-emitting element forming material as a pattern-forming material in the receiving holes 67, and drying the droplets in the same manner as in the first embodiment. The organic EL layers 69 in the present embodiment are formed by a light-emitting element forming material that emits light of the corresponding color, or, specifically, a red light-emitting element forming material that emits red light, a green light-emitting element forming material that emits green light, or a blue light-emitting element material that emits blue light.

Cathodes 70 composed of aluminum or another such metallic film that reflect light are formed on the top sides of the organic EL layers 69. The cathodes 70 are formed so as to cover substantially the entire surface of the element-forming surface 51s, and are designed to supply a common electric potential to the light-emitting element forming areas 59 by sharing the pixels 57. In the present embodiment, the organic electro-luminescence elements (organic EL elements 71) are configured as light-emitting elements by the anodes 64, the organic EL layers 69, and the cathodes 70.

A bonding layer 72 composed of an epoxy resin or the like is formed on the top sides of the cathodes 70 (organic EL elements 71), and a sealing substrate 73 that covers the element-forming surface 51s is attached to the transparent substrate 51 by means of the bonding layer 72. The sealing substrate 73 is an alkali-free glass substrate designed to prevent oxidation of the organic EL elements 71, the lines 52, 53, and 54, and other components.

When a drive electric current corresponding to the data signals is supplied to the anodes 64, the organic EL layers 69 emit light of a luminosity corresponding to the drive electric current. At this time, the light emitted from the organic EL layers 69 towards the cathodes 70 is reflected by the cathodes 70. Therefore, most of the light emitted from the organic EL layers 69 passes through the anodes 64, the insulating film 65, and the transparent substrate 51, and is emitted outward from the reverse side (display surface 51t) of the transparent substrate 51. Specifically, a full-color screen based on the data signals is displayed on the display surface 51t of the organic EL display 50.

Next, the method for manufacturing the organic EL display 50 will be described.

First, The TFTs 61 and 62, the lines 52, 53, and 54, and the insulating film 65 are formed on the element-forming surface 5 is of the transparent substrate 51 on the basis of conventional organic EL display manufacturing techniques. Then, a transparent conductive film is deposited over the entire element-forming surface 5 is (on the insulating film 65), and this transparent conductive substrate is patterned to form the anodes 64.

When the anodes 64 are formed, the entire surface of the element-forming surface 51s (anodes 64 and insulating film 65) is coated with a fluororesin or another such organic material to form a partitioning layer, and this partitioning layer is exposed to light of a specific wavelength. At this time, a mask having a light-blocking pattern for blocking the exposure light and also a semitransparent pattern for transmitting a specific percentage of the exposure light is disposed on the transparent substrate that transmits the exposure light of a specific wavelength, similar to the mask Mk in the first embodiment, such that the partitions 68 (receiving holes 67) are formed on the top surface of the anodes 64, and multiple residue fragments are formed in the same manner as in the first embodiment.

When an etching solution for etching the anodes 64 is ejected from the droplet ejection head 45 into the receiving holes 67, convex surfaces disposed opposite the residue fragments are formed in the top surfaces of the anodes 64, and uneven surfaces 64b can be formed in the top surfaces of the anodes 64 in the same manner as in the first embodiment.

Then, when minute droplets of a solution of light-emitting element forming material are ejected from the droplet ejection head 45 into the receiving holes 67, the ejected minute droplets are deposited on the uneven surfaces 64b and are drawn into the inner edges (partitions 68) of the receiving holes 67 while being guided by the unevenness in the uneven surfaces 64b. Droplets of a light-emitting element forming material that wet all of the entire receiving holes 67 can thereby be formed, and organic EL layers 69 with a uniform shape can be formed on the uneven surfaces 64b by drying and solidifying the droplets.

When the organic EL layers 69 are formed, the cathodes 70 composed of aluminum or another such metallic film are deposited over the entire surface of the element-forming surface 51s (on the organic EL layers 69 and the partitioning layers 22), and the organic EL elements 71 composed of the anodes 64, the organic EL layers 69, and the cathodes 70 are formed. When the organic EL elements 71 are formed, the entire surfaces of the top sides of the cathodes 70 are coated with an epoxy resin or the like to form the bonding layer 72, and the sealing substrate 73 is attached to the transparent substrate 51 by means of this bonding layer 72.

An organic EL display 50 in which the organic EL layers 69 have uniform shapes can thereby be manufactured.

According to the second embodiment configured as described above, before the organic EL layers 69 are formed, the uneven surfaces 64b are formed in the anodes 64, and droplets of a light-emitting element forming material are formed on the uneven surfaces 64b. Therefore, droplets whose wetting action extends up to the inner edges (partitions 68) of the organic EL layer forming areas can be formed. As a result, the organic EL layers 69 can be formed with a uniform shape, and the productivity of the organic EL display 50 can be enhanced.

The embodiments described above may be modified as follows. In the first embodiment, the coloring layers 38R, 38G, and 38B were formed in a striped pattern, but they are not limited thereto and may also be formed in a mosaic pattern or a delta pattern.

In the first embodiment, the etching solution Le was ejected by the droplet ejection apparatus, but the present invention is not limited to this option alone, and the filter-forming surface 14s may also be saturated with the etching solution Le.

In the first embodiment, the configuration included two TFDs, but the configuration is not limited to this option alone, and another possibility is for the configuration to have one TFD, for example, depending on the desired element design. In other words, the configuration may have one or more TFDs.

In the second embodiment, the configuration included two TFTs, but the configuration is not limited to this option alone, and another possibility is for the configuration to include one TFT or multiple TFTs, for example, depending on the desired element design.

In the embodiments described above, the configuration had uneven surfaces 32 and 64b formed on the anodes 64 and the filter-forming surface 14s as a foundation layer. The present invention is not limited to this option alone. Another possibility is that when, for example, the lines 17 and 40 are formed by droplets, the uneven surfaces 32 may be formed on the foundation layer of the lines 17 and 40, or the uneven surfaces 32 may be fashioned on the foundation layer into a pattern formed by solidifying the droplets.

In the embodiments described above, the droplets Ds2 and Ds3 were formed by inkjet methods, but the present invention is not limited to this option alone, and the droplets may also be formed by spin coating or dispensing methods, for example.

In the embodiments described above, an electro-optical apparatus was specified as a liquid crystal display device 10 and an organic EL display 50, but the present invention is not limited to this option alone. Another possibility is a field-effect display (FED, SED, or the like) that includes, for example, flat electron emission elements and that uses light emitted by a fluorescent material under the action of electrons emitted from these elements.

This application claims priority to Japanese Patent Application No. 2005-013700. The entire disclosure of Japanese Patent Application No. 2005-013700 is hereby incorporated herein by reference.

What is claimed is:

1. A pattern-forming method comprising:
    forming a partitioning layer on a foundation layer;
    forming a preliminary partitioning on the foundation layer by removing part of the partitioning layer, the preliminary partitioning including a partitioning and a residue fragment of the partitioning layer left in a pattern-forming area enclosed by the partitioning;
    performing patterning on the foundation layer using the residue fragment of the partitioning layer as a mask, thereby forming an uneven surface in the pattern-forming area on the foundation layer; and
    ejecting droplets containing a pattern-forming material onto the pattern-forming area to form a pattern on the foundation layer.

2. The pattern-forming method according to claim 1, wherein
    when the patterning is performed on the foundation layer using the residue fragment as the mask, the residue fragment is removed while the uneven surface is formed on the foundation layer.

3. The pattern-forming method according to claim 1, wherein
    a range of unevenness of the uneven surface on the foundation layer is 0.1 μm or greater.

4. The pattern-forming method according to claim 1, wherein
    when the patterning is performed on the foundation layer using the residue fragment as the mask, an etching solution for forming the uneven surface on the foundation layer is ejected from a droplet ejection apparatus onto the pattern-forming area.

5. The pattern-forming method according to claim 1, wherein
    the pattern-formation method is a color filter manufacturing method,
    the foundation layer is a surface of a transparent substrate, the pattern-forming area enclosed by the surface of the transparent substrate and the partitioning is a coloring layer-forming area, and the pattern-forming material contained in the droplets is a coloring layer-forming material.

6. The pattern-forming method according to claim 1, wherein the pattern-formation method is a color filter manufacturing method, the foundation layer is a surface of a transparent substrate, the pattern-forming area enclosed by the surface of the transparent substrate and the partitioning is a reflective layer-forming area, and the pattern-forming material contained in the droplets is a reflective layer-forming material.

7. A color filter manufactured by a color filter manufacturing method including steps of:

forming a partitioning layer on a surface of a transparent substrate;

forming a preliminary partitioning on the transparent substrate by removing part of the partitioning layer, the preliminary partitioning including a partitioning and a residue fragment of the partitioning layer left in a coloring layer-forming area enclosed by the partitioning;

performing patterning on the surface of the transparent substrate using the residue fragment of the partitioning layer as a mask, thereby forming an uneven surface in the coloring layer-forming area on the surface of the transparent substrate; and ejecting droplets containing a coloring layer-forming material onto the coloring layer-forming area to form a pattern on the surface of the transparent substrate.

8. A color filter manufactured by a color filter manufacturing method including steps of:

forming a partitioning layer on a surface of a transparent substrate;

forming a preliminary partitioning on the transparent substrate by removing part of the partitioning layer, the preliminary partitioning including a partitioning and a residue fragment of the partitioning layer left in a reflective layer-forming area enclosed the partitioning;

performing patterning on the surface of the transparent substrate using the residue fragment of the partitioning layer as a mask, thereby forming an uneven surface in the reflective layer-forming area on the surface of the transparent substrate; and ejecting droplets containing a reflective layer-forming material onto the reflective layer-forming area to form a pattern on the surface of the transparent substrate.

9. An electro-optical apparatus manufactured by a pattern forming method including steps of:

forming a partitioning layer on a foundation layer that is an electrode layer;

forming a preliminary partitioning on the foundation layer by removing part of the partitioning layer, the preliminary partitioning including a partitioning and a residue fragment of the partitioning layer left in a pattern-forming area that is a light-emitting element forming area enclosed by the partitioning;

performing patterning on the foundation layer using the residue fragment of the portioning layer as a mask, thereby forming an uneven surface in the pattern-forming area on the foundation layer; and ejecting droplets containing a pattern-forming material that is a light-emitting element forming material onto the pattern-forming area to form a pattern on the foundation layer.

* * * * *